(12) United States Patent
Schoenberger et al.

(10) Patent No.: US 8,896,320 B2
(45) Date of Patent: *Nov. 25, 2014

(54) MEASURING DEVICE AND A METHOD FOR MEASURING A CHIP-TO-CHIP-CARRIER CONNECTION

(75) Inventors: Franz Schoenberger, Munich (DE); Johann Koelz, Vaterstetten (DE); Ming Xue, Singapore (SG)

(73) Assignee: Infineon Technologies AG, Neubiberg (DE)

( * ) Notice: Subject to any disclaimer, the term of this patent is extended or adjusted under 35 U.S.C. 154(b) by 395 days.

This patent is subject to a terminal disclaimer.

(21) Appl. No.: 13/222,101

(22) Filed: Aug. 31, 2011

(65) Prior Publication Data

US 2013/0049766 A1    Feb. 28, 2013

(51) Int. Cl.
| | | |
|---|---|---|
| *G01R 31/04* | (2006.01) | |
| *G01R 31/312* | (2006.01) | |
| *G01R 31/28* | (2006.01) | |

(52) U.S. Cl.
CPC .......... *G01R 31/312* (2013.01); *G01R 31/2853* (2013.01)
USPC ........................................ 324/538

(58) Field of Classification Search
CPC ............. G01R 31/312; G01R 31/2812; G01R 31/046; G01R 31/31855; G01R 27/2605
USPC ............ 324/519, 530, 537, 538, 686, 754.28, 324/762.02, 763.01
See application file for complete search history.

(56) References Cited

U.S. PATENT DOCUMENTS

| | | | |
|---|---|---|---|
| 5,041,780 A | * | 8/1991 | Rippel ...................... 324/117 H |
| 5,218,294 A | | 6/1993 | Soiferman |
| 5,254,953 A | | 10/1993 | Crook et al. |
| 5,498,964 A | * | 3/1996 | Kerschner et al. ............ 324/530 |
| 6,744,267 B2 | | 6/2004 | Sauk et al. |

(Continued)

FOREIGN PATENT DOCUMENTS

| | | |
|---|---|---|
| CN | 1653341 A | 8/2005 |
| CN | 1751745 A | 3/2006 |
| CN | 1953276 A | 4/2007 |

OTHER PUBLICATIONS

TestJet/VTEP Hardware Description and Verification, Agilent Technologies, Inc. 2008, Printed in Singapore, Aug. 1, 2008, 5989-9375EN, www.agilent.com/find/emailupdates, pp. 1-64.
Non-final office action of Oct. 28, 2013 issued for U.S. Appl. No. 13/222,121.

(Continued)

*Primary Examiner* — Melissa Koval
*Assistant Examiner* — Daniel Miller

(57) ABSTRACT

A measuring device is provided: the measuring device including: a power supply configured to provide electric power to a chip via at least one of a chip connection and a chip-carrier connection; a chip arrangement receiving portion configured to receive a chip arrangement, the chip arrangement including a chip and a chip-carrier connected to the chip via one or more chip-to-chip-carrier connections; a detection portion including a plate; a detection circuit coupled to the plate and configured to detect an electrical signal from the plate; wherein the plate is configured such that it covers at least part of at least one of the chip, the chip-carrier, and the chip-to-chip-carrier connection; and wherein the plate is further configured such that at least part of the at least one of the chip, the chip-carrier, and the chip-to-chip-carrier connection is uncovered by the plate.

20 Claims, 12 Drawing Sheets

(56) References Cited

U.S. PATENT DOCUMENTS

| | | |
|---|---|---|
| 6,825,673 B1 | 11/2004 | Yamaoka |
| 7,147,499 B1 | 12/2006 | Mayder et al. |
| 7,437,262 B2 | 10/2008 | Boose et al. |
| 2005/0099186 A1 | 5/2005 | Parker et al. |
| 2005/0242824 A1* | 11/2005 | Parker et al. .................. 324/538 |
| 2006/0006894 A1 | 1/2006 | Ho et al. |
| 2007/0013383 A1* | 1/2007 | Parker et al. .................. 324/519 |
| 2008/0001617 A1 | 1/2008 | Johnson |
| 2011/0148446 A1* | 6/2011 | Suto ........................... 324/750.3 |

OTHER PUBLICATIONS

English language abstract of CN1751745A.
Notice of Allowance issued for related US13222121 on Sep. 2, 2014.
Tao Li-fang et al., "Research on Methods of IC Faults Diagnosis", Computer and Modernization No. 5, 2009, 1 page.
Chen Fei, "Research on Diagnosis of Defaults in Digital Circuits Based on Current Signal", Chinese Master's Theses Full-Text Database, Information Technology, No. 6, Jan. 2008, 83 pages.
Office Action issued for corresponding CN201210320660.9 on Aug. 4, 2014 together with its English translation.

* cited by examiner

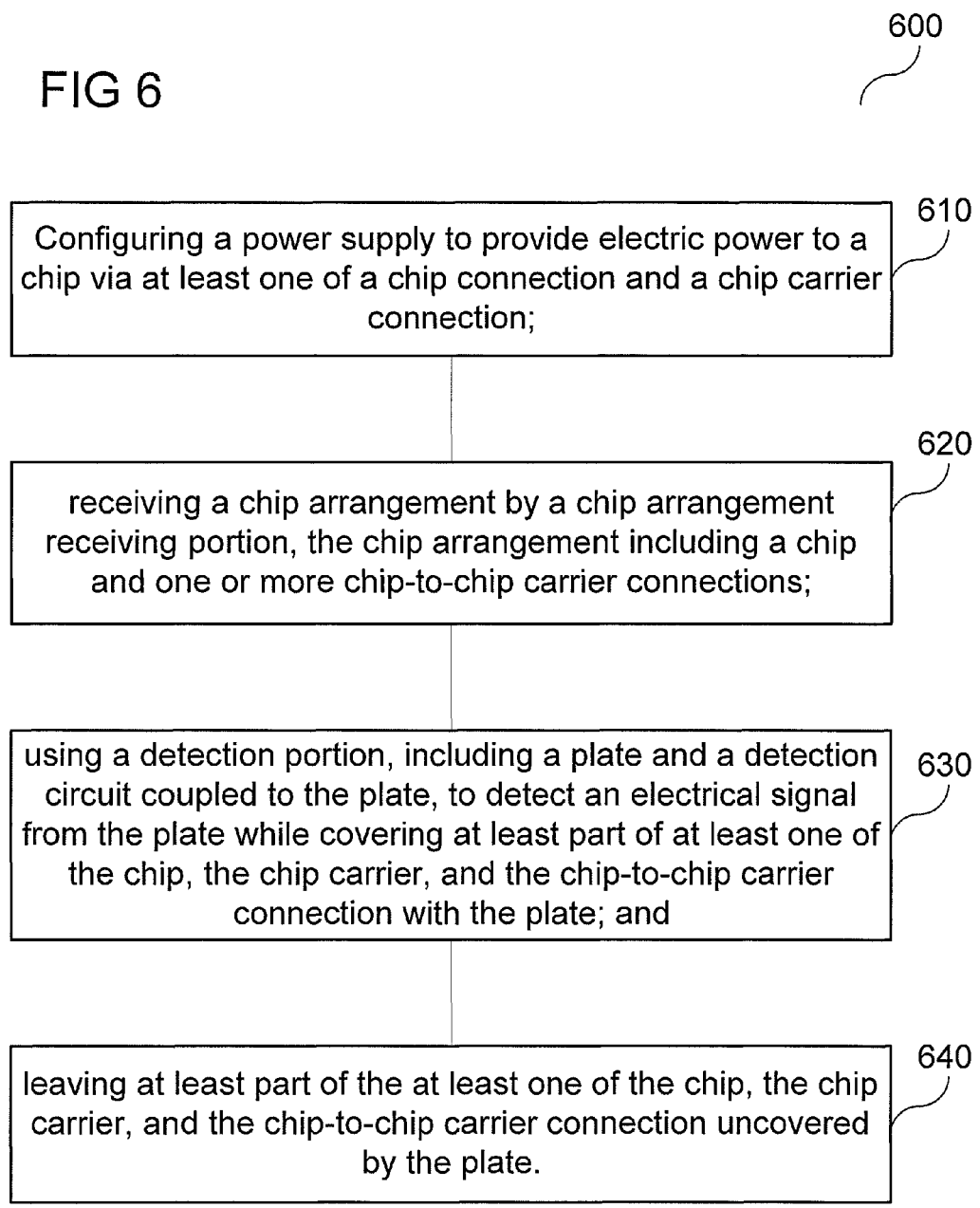

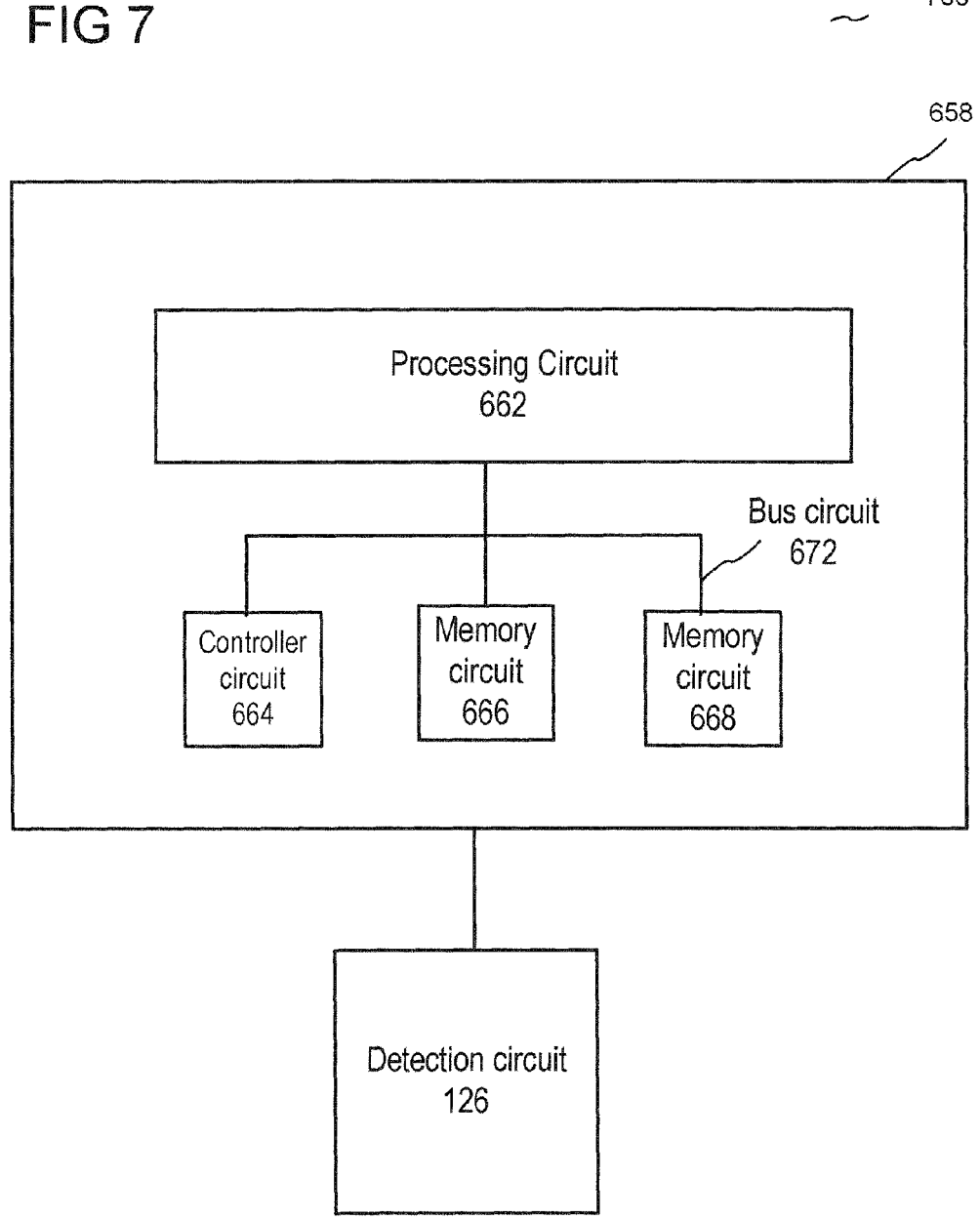

MEASURING DEVICE AND A METHOD FOR MEASURING A CHIP-TO-CHIP-CARRIER CONNECTION

TECHNICAL FIELD

Various embodiments relate generally to a measuring device and a method for measuring a chip-to-chip-carrier connection.

BACKGROUND

During the production of integrated circuits, e.g. semiconductor devices such as microcontroller devices, a semiconductor chip may be connected, e.g. glued, e.g. bonded, to a leadframe. The semiconductor chip to leadframe connection may further be sprayed or molded in a chip-housing. Through these productions steps, the fingers of the lead frame may be bent or disturbed. Drifting or movement of the bond wires may arise, due to manufacturing errors. These manufacturing anomalies may be only recognized in the final test, e.g. the end test. Short circuits between the pins, e.g. between the pins of the integrated circuit, may be realized using productions testing at fixed measuring points, and at pre-defined temperatures, e.g. at room, high or low temperatures. Chips which lie on the fringe of performance, "outliers", are those which are not obviously known to show short circuit characteristics during the end test. They represent a quality risk, as they may end up being delivered to the customers, without having displayed any short circuits during the manufacturing tests. Following delivery, e.g. to an end consumer, the chips may fail, therefore creating problems with respect to the quality of chip manufacturing and production. If these problems were to be eliminated and recognized early, chips with faulty connections to the leadframe may be removed early.

Up till now, the location of fingers of a leadframe and the location and shape of bond wires may be inspected through X-ray inspections systems. Such a method is usually very complex, and can at best, only be applied to a sample part of the chip. In other words, such a method is too complex and expensive to be applied to the entire chip, and therefore, faults may be left undetected, or unchecked. In rare cases, an optical x-ray controller may be used to test the entire chip, e.g. 100% of the chip. However, this is costly and time consuming. Other test equipment systems may generally lack the sensitivity to detect low quality connections between the fingers of the lead frame and the bond wires.

SUMMARY OF THE INVENTION

Various embodiments provide a measuring device including: a power supply configured to provide electric power to a chip via at least one of a chip connection and a chip-carrier connection; a chip arrangement receiving portion configured to receive a chip arrangement, the chip arrangement including a chip and a chip-carrier connected to the chip via one or more chip-to-chip-carrier connections; a detection portion including a plate; a detection circuit coupled to the plate and configured to detect an electrical signal from the plate; wherein the plate is configured such that it covers at least part of at least one of the chip, the chip-carrier, and the chip-to-chip-carrier connection; and wherein the plate is further configured such that at least part of the at least one of the chip, the chip-carrier, and the chip-to-chip-carrier connection is uncovered by the plate.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments of the invention are described with reference to the following drawings, in which:

FIG. 6 shows a method for measuring a chip-to-chip connection using a measuring device according to an embodiment;

FIG. 7 shows a computer arrangement configured to execute instructions for measuring a chip-to-chip-carrier connection;

DESCRIPTION

The following detailed description refers to the accompanying drawings that show, by way of illustration, specific details and embodiments in which the invention may be practiced.

The word "exemplary" is used herein to mean "serving as an example, instance, or illustration". Any embodiment or design described herein as "exemplary" is not necessarily to be construed as preferred or advantageous over other embodiments or designs.

An automated measuring system which is capable of measuring the bulk characteristics of carrier connections may be used to detect any deviations from the bulk characteristics. Such an automated measuring system may include a capacitive measuring system for inspecting an integrated circuit, e.g. a device under test, e.g. a chip. Deviation from an expected capacitance measurement may then be detected.

Current capacitive measurement functions, e.g. vector-less testing, are only sufficiently sensitive for detecting faults in printed circuit boards, e.g. detecting clear open circuits caused by defective solder joints. However, they are too imprecise for a capacity test for a semiconductor device at the component level, e.g. to measure defects caused by faulty bond wires. For example, VTEP (Vector-less Test Enhanced Performance) technology from Agilent™ Technologies is currently used as part of a printed circuit board assembly PCBA End test system. The Agilent™ VTEP system is configured to determine capacitance at fixed measuring points on the PCB, the system including a VTEP multiplexer card, a VTEP amplifier card AMP board, and a sensor plate.

Various embodiments may provide an automated measuring device, for the precise measurement of changes in capacitance caused by connection defects in an integrated circuit module, e.g. faults in bond wires between a chip and a leadframe, "near-short" states between bond wires, "near-short" states between lead frames and vertical sagging of bond wires. Various embodiments may further provide an automated measuring device such that each obtained measurement may be accurately and efficiently matched to a connection fault e.g. to a particular chip and chip-housing, lead frame finger, lead frame pin or bond wire.

Figure 1A:
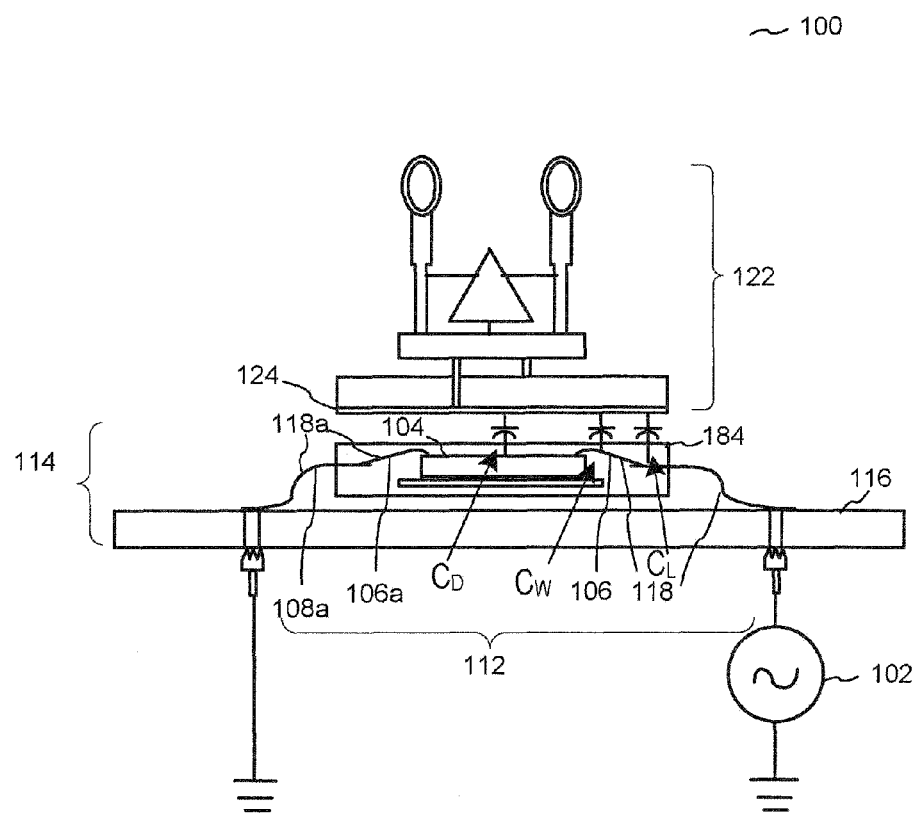
FIGS. 1A, 1B, 1C and 1D show a measuring device according to an embodiment.

FIG. 1A shows a measuring device 100, according to an embodiment. Measuring device 100 may include a power supply 102, e.g. an AC signal source configured to provide electric power, e.g. an electrical signal, e.g. an AC source signal, to a chip (which may also be referred to as bare die) 104 via at least one of a chip connection 106 and a chip-carrier connection 108; a chip arrangement receiving portion 112 configured to receive a chip arrangement 114, the chip arrangement 114, e.g. a device under test, including a chip 104, and a chip-carrier 116 connected to the chip 104 via one or more chip-to-chip-carrier connections 118; a detection portion 122 including a plate 124 configured to cover at least part of chip arrangement 114 and a detection circuit 126 coupled to plate 124 and configured to detect an electrical signal from plate 122.

Figure 1B:
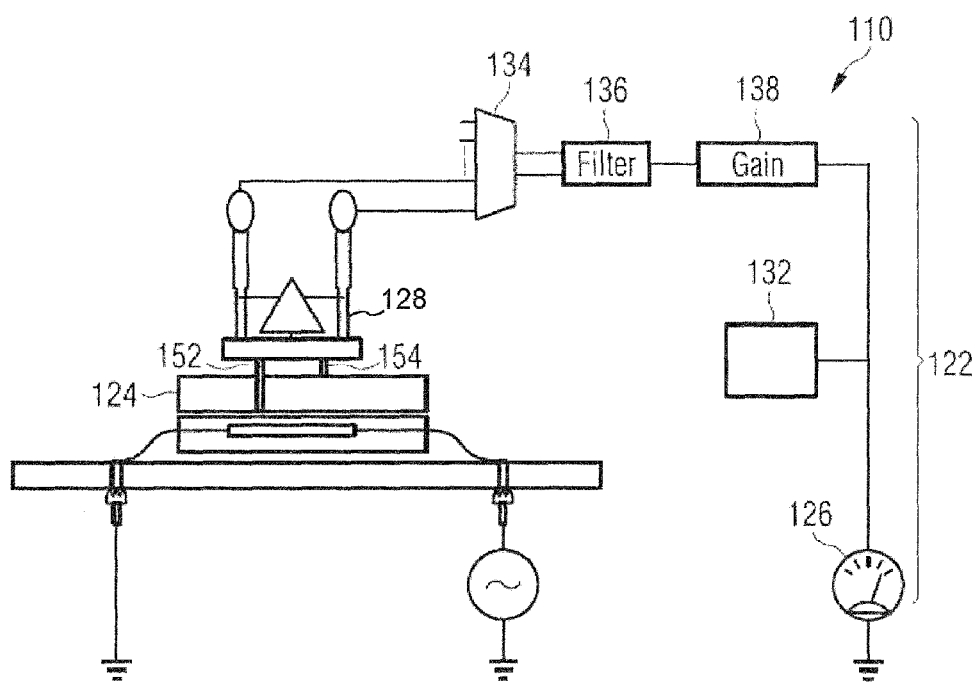

Detection portion 122 including detection circuit 126 is shown in illustration 110 of FIG. 1B.

Chip 104 may include a semiconductor chip, e.g. a silicon chip, e.g. a microcontroller device. Each chip-to-chip-carrier connection 118 may include a chip-carrier connection 108 connected to chip 104 via a chip connection 106, e.g. chip-to-chip-carrier connection 118a may include a chip-carrier connection 108a connected to chip 104 via a chip connection 106a, e.g. chip-to-chip-carrier connection 118b may include a chip-carrier connection 108b connected to chip 104 via a chip connection 106b. Chip connection 106 may include a bond wire. Chip connection 106 may include an electrically conductive material. Chip-carrier connection 108 may include part of a leadframe. Chip-carrier connection 108 may include a leadframe finger. Chip-carrier connection 108 may include a leadframe pin. Chip-carrier connection 108 may include an electrically conductive material. Chip-carrier connection 108 may include at least part of one or more from the following group of chip-carrier connections, the group consisting of: a lead frame, an electrically conductive trace, a metal trace in substrate, an electrically conductive wire, a wire bond, a flip-chip bump, a through-silicon via TSV, a through-mold via TMV, a chip-package interconnect. Chip-carrier connection 108 may include at least part of one or more from the following group of chip-carrier connections, the group consisting of: a lead frame, an electrically conductive trace, a metal trace in substrate, an electrically conductive wire, a wire bond, a flip-chip bump, a through-silicon via TSV, a through-mold via TMV, a chip-package interconnect. Chip arrangement 114 may include a plurality of chip-carrier connections 108, 108a, 108b, e.g. a plurality of leadframe fingers, forming part of a leadframe. E.g. a 144-pin leadframe housing may include 144 leadframe fingers.

Chip arrangement 114 may include chip 104 and a plurality of chip-to-chip-carrier connections 118, 118a, 118b, 118c. Measuring device 100 may be configured to determine the state of each of the plurality of chip-to-chip-carrier connections 118, 118a, 118b, 118c. Measuring device 100 may be configured to measure a capacitive value induced in a region surrounding a chip-to-chip-carrier connection 118. A deviation in a capacitive value of chip-to-chip-carrier connection 118, may be indicative of a poor quality between chip connection 106 and chip-carrier connection 108 which forms chip-to-chip-carrier connection 118. A deviation in a capacitive value of chip-to-chip-carrier connections 118, may be indicative of an anomaly, e.g. sweep, e.g. vertical sagging of chip connection 106. A deviation in a capacitive value of chip-to-chip-carrier connections 118, may be indicative of an anomaly, e.g. bending, of chip-carrier connection 108.

Chip-carrier 116 may include a printed circuit board. Power supply 102 may include an AC power source.

As shown in FIG. 1B, detection portion 122 of measuring device 100 may include a buffer assembly 128, e.g. a low noise buffer assembly, in electrical connection with plate 124. Detection portion 122 may include scanner 134, filter 136 and gain amplifier 138. Buffer assembly 128 may be in electrical connection with scanner 134. Scanner 134 may be in electrical connection with filter 136. Filter 136 may be in electrical connection with gain amplifier 138. Gain amplifier 138 may be in electrical connection with detection circuit 126. Detection circuit 126 may include a digital signal processing DSP based AC detector. Detection portion 122 of measuring device 100 may include a multiplexer circuit 132 for selecting an electrical signal from plate 124.

Multiplexer circuit 132 may be in electrical connection with plate 124. Detection circuit 126 may be in electrical connection with multiplexer circuit 132. Detection portion 122 of measuring device 100 may further include a processing circuit for processing one or more electrical signals detected by detection circuit 126.

Figure 1C:
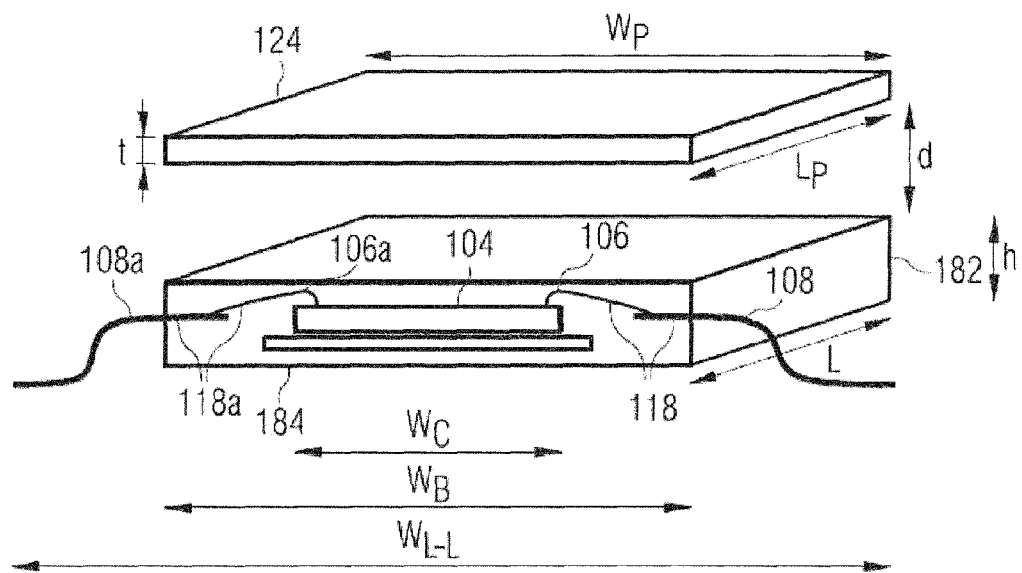
Figure 1D:
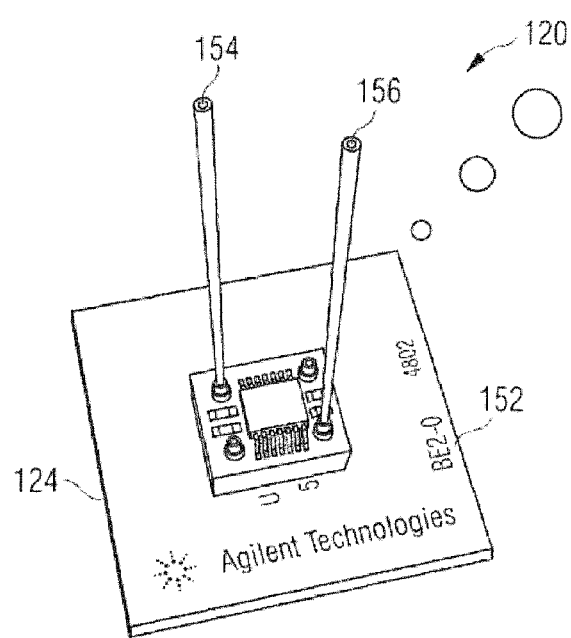

As shown in illustration 120 of FIG. 1D, plate 124 may be electrically connected to an amplifier board 152, e.g. an Agilent™ VTEP AMP board. Amplifier board 152 may be formed directly on or indirectly on plate 124. Plate 124 may be electrically connected to detection circuit 126 via a signal pin 154 and a ground pin 156. Plate 124 may be electrically connected to amplifier board via signal pin 154 and ground pin 156. Amplifier board 152 may be electrically connected to detection circuit 126. Amplifier board 152 may be configured to amplify signals sensed by plate 124.

Chip arrangement 114 may include chip-packaging module 182 shown in FIG. 1C.

Chip-packaging module 182 may include at least part of chip 104 and chip-to-chip-carrier connection 118 and chip housing 184, e.g. a mold material, wherein at least part of chip 104 and chip-to-chip-carrier connection 118 may be held, e.g. molded, by mold material 184.

Chip-packaging module 182 may include at least part of chip 104, chip connection 106, chip-carrier connection 108 and chip housing 184, e.g. a mold material wherein at least part of chip 104, chip connection 106 and chip-carrier connection 108 may be held, e.g. molded, by mold material 184.

Plate 124 may include a probe plate sensor. Plate 124 may be configured to cover at least part of chip arrangement 114. Plate 124 may be configured such that it covers chip arrangement 114, e.g. plate 124 may cover chip 104, and at least one of the plurality of chip-to-chip-carrier connections 118, 118a, 118b. Plate 124 may be arranged above at least a part of chip arrangement 114, e.g. plate 124 may be configured such that it is situated a pre-determined distance d above chip arrangement 114, e.g. plate 124 may be separated from chip arrangement 114 by a pre-determined distance d.

Plate 124 may include a spring-loaded plate arranged as close as possible to chip arrangement 114. Plate 124 may be separated from chip arrangement 114 by a pre-determined distance d ranging from about 0.5 mm to about 20 mm, e.g. from about 0.6 mm to about 10 mm, e.g. from about 0.7 mm to about 3 mm. Plate 124 may be placed as close as possible to chip arrangement 114 which allows at least part of chip arrangement 114, e.g. the device under test DUT, to be changed, e.g. removed and replaced with a further device under test DUT.

Plate 124 may be configured to cover at least part of chip-packaging module 182.

Plate 124 may be separated from chip-packaging module 182 by a pre-determined distance, d, ranging from about 0.5 mm to about 20 mm, e.g. from about 0.6 mm to about 10 mm, e.g. from about 0.7 mm to about 3 mm. Plate 124 may be placed as close as possible to chip-packaging module 182, which allows chip-packaging module 182 e.g. the device under test DUT, to be changed, e.g. removed and replaced with a further chip-packaging module 182 device under test DUT.

Chip-packaging module 182 may be described according to the following dimensions.

Chip-packaging module 182 may have a height h which represents the distance from a top side of chip packaging module 182 to a bottom side of chip-packaging module 182.

Chip-packaging module 182 may have a width $W_{L-L}$ and a length L, wherein width $W_{L-L}$ and length L are perpendicular to height h.

The distance between a distal tip of leadframe finger, e.g. 108a formed on a first side of chip housing 184 of chip packaging module 182 to a distal tip of lead frame finger e.g. 108 formed on a second side of chip housing 184, wherein the second side is formed on the opposite side of chip housing 184 to the first side, may be represented by a lead-to-lead width, $W_{L-L}$. $W_{L-L}$ may be perpendicular to the height h.

The distance between the first side of chip housing 184 of chip packaging module 182 and the second side of chip housing 184 of chip packaging module 182, wherein the second side is formed on the opposite side of chip housing 184 to the first side, may be represented by an integrated circuit body width, $W_B$. $W_B$ may be perpendicular to height h.

Chip-housing 184 of chip-packaging module 182 may have a cross sectional area of $W_B \times L$, which may include a cross sectional area of a top side of chip-housing 184. Cross sectional area $W_B \times L$, may include a cross sectional area of a bottom side of chip-housing 184.

Chip-packaging module 182 may have an extended cross sectional area of $W_{L-L} \times L$, which may include an extended cross sectional area of a top side of chip packaging module 182. Extended cross sectional area of $W_{L-L} \times L$ may include an extended cross sectional area of a bottom side of chip packaging module 182.

Chip 104 may have a width $W_C$ and a length $L_C$ (not shown), wherein $W_C$ and $L_C$ may be perpendicular to a thickness of chip 104.

Chip 104 may have a chip cross sectional area of $W_C \times L_C$, which may include a cross-sectional area of top side of chip 104. Cross sectional area of $W_C \times L_C$ may include a cross-sectional area of bottom side of chip 104.

Plate 124 may have a thickness t which represents the distance from a top side of plate 124 to a bottom side of plate 124.

Plate 124 may have a width $W_P$ and a length $L_P$, wherein $W_P$ and $L_P$ may be perpendicular to the thickness t.

Plate 124 may have a plate cross sectional area of $W_P \times L_P$, which may include a cross-sectional area of top side of plate 124. Cross sectional area of $W_P \times L_P$ may include a cross-sectional area of bottom side of plate 124.

The plate cross sectional area may be equal to or smaller than extended cross sectional area of chip-packaging module 182.

The plate cross sectional area may be equal to or smaller than extended cross sectional area of chip-packaging module 182, and larger than the chip cross sectional area.

The plate cross sectional area may be equal to or smaller than cross sectional area of chip-packaging module 182.

The plate cross sectional area may be equal to or smaller than cross sectional area of chip-packaging module 182, and larger than the chip cross sectional area.

Width $W_P$ of plate 124 may be equal to or smaller than the width $W_{L-L}$ of chip-packaging module 182.

Width $W_P$ of plate 124 may be equal to or smaller than the width $W_{L-L}$ of chip-packaging module 182, and larger than the width $W_C$ of chip 104.

Width $W_P$ of plate 124 may be equal to or smaller than width $W_B$ of chip-packaging module 182.

By way of example, with a 10 mm×10 mm chip-packaging module 182, i.e. $W_B$=10 mm, L=10 mm, plate 124 may be a 10 mm×10 mm plate, i.e. $W_P$=10 mm, $L_P$=10 mm.

By way of example, with a 10 mm×10 mm chip-packaging module 182, i.e. $W_B$=10 mm, L=10 mm, plate 124 may be a 9 mm×9 mm plate, i.e. $W_P$=9 mm, $L_P$=9 mm.

Width $W_P$ of plate 124 may be equal to or smaller than width $W_B$ of chip-packaging module 182, and larger than the width $W_C$ of chip 104.

Length $L_P$ of plate 124 may be equal to or smaller than length L of chip-packaging module 182.

Length $L_P$ of plate 124 may be equal to or smaller than length L of chip-packaging module 182, and larger than the width $W_C$ of chip 104.

At least one of length $L_P$ of plate 124 and width $W_P$ of plate 124 may be equal to or smaller than at least one of width $W_{L-L}$ and width $W_B$, and length L of chip-packaging module 182.

The dimensions of plate 124 may be selected according to the size of the chip arrangement 114. The dimensions of plate 124 may be selected according to the size of chip-packaging module 182. The dimensions of plate 124 may be selected according to the size of chip 104. The dimensions of plate 124 may be selected according to the size of chip 104 and chip to chip-carrier-connections 118.

Width $W_P$ of plate 124 may range from about 0.5 mm to about 40 mm, e.g. from about 10 mm to about 3 mm, e.g. about 15 mm to about 25 mm.

Length $L_P$ of plate 124 may range from about 0.5 mm to about 40 mm, e.g. from about 10 mm to about 3 mm, e.g. about 15 mm to about 25 mm.

Plate 124 may include a rectangular plate. Plate 124 may include an electrically conductive material. Plate 124 may include a multilayer electrically conductive material. Plate 124 may include one or more from the following group of materials, the group consisting of: Au, Cu, Ag, Al, Ti, Fe, Ni, brass and steel, e.g. V2A steel, NiP, CuAu, CuAg, CuNi.

Power supply 102 may be configured to provide electric power, e.g. AC power, e.g. an AC source signal, to a chip 104 via at least one of a first chip connection 106 and a first chip-carrier connection 108, e.g. AC power may be supplied to a leadframe finger, via a lead frame pin to chip 104. The AC signal provided may range between about −0.55V to about +0.55V, e.g. between about −0.4V to about +0.4V, e.g. between about −0.25V to about +0.25V. The AC signal should not extend lower than −0.55V and higher than +0.55 V to avoid current flow over device input diodes.

Plate 124 may be configured to sense capacitive signals from the at least part of chip arrangement 114 covered by plate 142. The capacitive signals may include contributions from at least one of a group of signals consisting of the following: capacitive impedance between chip arrangement 114 and plate 124, capacitive impedance, $c_D$, between chip 104 and plate 124, capacitive impedance, $c_W$, between chip connection 106 and plate 124, capacitive impedance, $c_L$, between chip-carrier connection 108 and plate 124.

Therefore, detection circuit 126 of detection portion 122 may be configured to detect at least one of a group of signals consisting of the following: capacitive impedance between chip arrangement 114 and plate 124, capacitive impedance, $C_D$, between chip 104 and plate 124, capacitive impedance, $C_W$, between chip connection 106 and plate 124, capacitive impedance, $C_L$, between chip-carrier connection 108 and plate 124.

Power supply 102 may be configured to provide electric power to chip 104 via at least one of a first chip connection 106 and a first chip-carrier connection 108 and wherein at least one further chip-carrier connection 108a of chip-carrier 116 may be guarded, e.g. connected to ground voltage.

The at least one further chip-carrier connection 108a may be adjacent to first chip-carrier connection 108. The at least one further chip-carrier connection 108a may include a plurality of further chip-carrier connections 108a, 108b, 108c. The at least one further chip-carrier connection 108a may include all further chip-carrier connections in chip arrangement 114.

According to various embodiments described below, a measuring device, may include a power supply 102 configured to provide electric power, e.g. AC power, e.g. an AC source signal, to a chip 104 via at least one of a chip connection 106 and a chip-carrier connection 108; a chip arrangement receiving portion 112 configured to receive a chip arrangement 114, chip arrangement 114 including a chip 104 and a chip-carrier 116 connected to chip 104 via one or more chip-to-chip-carrier connections 118; a detection portion 122 including: a plate 124; a detection circuit 126 coupled to plate 124 and configured to detect an electrical signal from plate 124; wherein plate 124 is configured such that it covers at least part of at least one of chip 104, chip-carrier 116, and chip-to-chip-carrier connection 118; and wherein plate 124 is further configured such that at least part of the at least one of chip 104, chip-carrier 116, and chip-to-chip-carrier connection 118 is uncovered by plate 124.

At least part of at least one of chip 104, chip-carrier 116, and chip-to-chip-carrier connection 118 being covered by plate 124, may mean that at least part of at least one of chip 104, chip-carrier 116, and chip-to-chip-carrier connection 118 may be electrically engaged with plate 124. E.g. plate 124 may be configured to sense or receive electrical signals, e.g. capacitive signals, transmitted by at least part of at least one of chip 104, chip-carrier 116, and chip-to-chip-carrier connection 118.

At least part of the at least one of chip 104, chip-carrier 116, and chip-to-chip-carrier connection 118 being uncovered by plate 124 may mean that at least part of the at least one of chip 104, chip-carrier 116, and chip-to-chip-carrier connection 118 may be electrically disengaged with plate 124. E.g. plate 124 may be configured such that the sensing of electrical signals, e.g. capacitive signals, transmitted by at least part of the at least one of chip 104, chip-carrier 116, and chip-to-chip-carrier connection 118 is minimised or prevented.

Figure 2A:
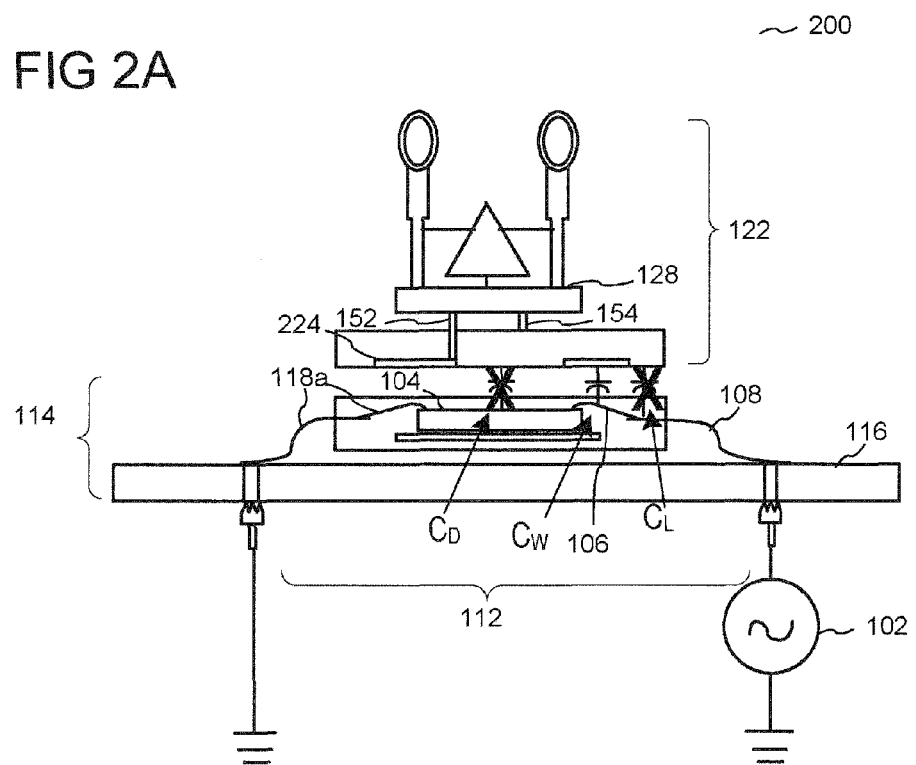
FIGS. 2A, 2B and 2C show a measuring device according to an embodiment.

FIG. 2A shows a measuring device 200 according to an embodiment. The basic functionalities of all the features described with respect to measuring device 100 are applicable to measuring device 200. Plate 124 of measuring device 100 is modified to plate 224. The functionalities of the features described above with respect to plate 124 are applicable to plate 224.

Plate 224 is configured such that it covers at least part of at least one of chip 104, chip-carrier 116, and chip-to-chip-carrier connection 118; and wherein plate 224 is further configured such that at least part of at least one of chip 104, chip-carrier 116, and chip-to-chip-carrier connection 118 is uncovered by plate 224.

Plate 224 may be configured such that it covers at least part of one or more chip-to-chip-carrier connections 118 and such that at least part of chip 104 and chip-carrier 116 is uncovered by plate 224.

Plate 224 may be configured such that it covers at least part of one or more chip connections 106 and that at least part of chip 104, at least part of chip-carrier 116 and at least part of one or more chip-carrier connections 108 are uncovered by plate 224.

A portion of chip arrangement 114 may be uncovered by plate 224, e.g. chip 104 may be uncovered by plate 224. Plate 224 may be configured to cover at least part of the one or more chip-to-chip-carrier connections 118.

Figure 2B:
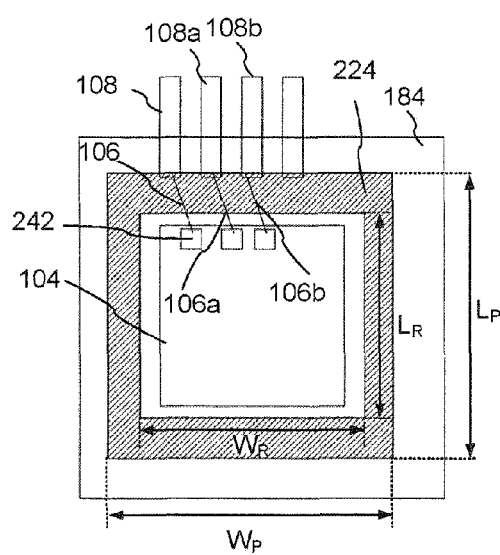
Figure 2C:
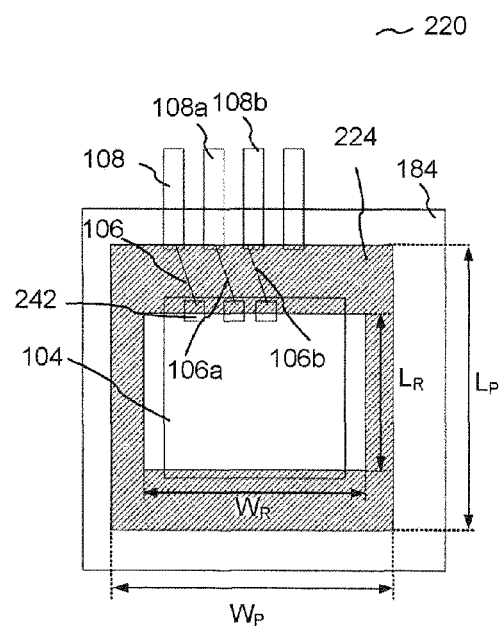

Plate 224 may include a ring plate, as shown in illustration 210 of FIG. 2B, e.g. wherein a portion of plate 124, e.g. a two-dimensional rectangular plate, may be removed to form ring plate 224. FIG. 2B illustrates a view from a top side of plate 224. Plate 224 may include a ring plate wherein a center portion of plate 124 may be removed to form ring plate 224. As chip arrangement 114 may include a plurality of chip-to-chip carrier connections 118, 118a, 118b, wherein each chip-to-chip carrier connection, e.g. 118 including a chip-carrier connection, e.g. 108 connected to chip 104 via a chip connection, e.g. 106, may converge at chip 104, a ring plate 224 easily leaves chip 104 uncovered while covering the plurality of chip-to chip carrier connections 118, 118a, 118b, converging at chip 104. The size of plate 224 may be adapted such that plate 224 may be configured to cover one or more chip connections 106, 106a, 106b of the plurality of chip-to chip carrier connections 118, 118a, 118b, and leaving one or more chip-carrier connections 108, 108a, 108b and chip 104 uncovered. The size of plate 224 may be adapted such that plate 224 may be configured to cover one or more chip-carrier connections 108, 108a, 108b of the plurality of chip-to chip carrier connections 118, and leaving one or more chip connections 106, 106a, 106b and chip 104 uncovered. Furthermore, plate 224 may be configured as shown in illustration 220 of FIG. 2C to cover areas where possible bending and anomalies occur, e.g. bonding areas 242 of the device components, where anomalies, e.g. bending, and "near-short" phenomena can occur. Plate 224 may be configured to cover as little of chip 104 as possible.

With plate 124 of measuring device 100 described with respect to FIGS. 1A, 1B and 1C, the capacitive signal detected by detection circuit 126 of detection portion 122 may detect a capacitive contribution from chip arrangement 114, including the capacitive impedance, $C_D$, between chip 104 and plate 124, the capacitive impedance, $C_W$, between chip connection 106 and plate 124 and the capacitive impedance, $C_L$, between chip-carrier connection 108 and plate 124.

With modified plate 224, plate 224 may be matched to a target area of chip arrangement 114, e.g. specifically to chip connection 106, thereby improving the detection of the target area of chip arrangement 114, e.g. chip connection 106. The target area of chip arrangement 114 may include a plurality of chip connections 106. This promotes a mechanism of competitive detection of wire deformation, thereby minimizing noise from a non-targeted detection area of chip arrangement 114. E.g. Capacitive signals from the non-targeted detection areas chip 104 and chip-carrier connection 108 may be minimized. E.g., capacitive impedance, $C_L$, between chip-carrier connection 108 and plate 124 and capacitive impedance, $C_D$, between chip 104 and plate 124 may be minimized.

Ring probe plate 224 may include a lateral two-dimensional plate, with a portion removed. Ring probe plate 224 may include a lateral two-dimensional plate, with a center portion removed. Ring probe plate 224 may include a lateral two-dimensional plate with a hole.

Ring probe plate 224 may have outer ring dimensions defined as the dimensions of probe plate 124 as described above. Ring probe plate 224 may have an outer ring dimension having a width $W_P$ and a length $L_P$, wherein $W_P$ and $L_P$ may be perpendicular to the thickness t or probe plate 224. The features described with respect to the dimensions of $W_p$ and a length $L_P$, described with respect to probe plate 124 apply to ring probe plate 224.

Ring probe plate 224 may have inner ring dimensions, the inner ring defining the area of the removed portion, e.g. the hole, wherein the inner ring may have a width $W_R$ and a length $L_R$. In other words, the removed portion could have a width $W_R$ and a length $L_R$. In other words, the cross sectional area of the removed portion, e.g. the hole, may be $W_R \times L_R$.

The cross sectional area of the removed portion, e.g. the hole in plate 224 may be equal to or smaller than the cross sectional area of the chip. The cross sectional area of the removed portion, e.g. the hole in plate 224 may be larger than the cross sectional area of the chip.

Length $L_R$ of the removed portion, e.g. the hole in plate 224, may be equal to or smaller than length $L_C$ of chip 104.

Width $W_R$ of the removed portion, e.g. the hole in plate 224, may be equal to or smaller than length $W_C$ of chip 104.

At least one of a length $L_P$ of the removed portion, e.g. the hole in plate 224, and width $W_R$ of the removed portion, e.g. the hole in plate 224, may be equal to or smaller than at least one of a width $W_C$, and length $L_C$ of chip 104.

Width $W_P$ of plate 224 may range from about 0.5 mm to about 40 mm, e.g. from about 10 mm to about 3 mm, e.g. about 15 mm to about 25 mm.

Length $L_P$ of plate 224 may range from about 0.5 mm to about 40 mm, e.g. from about 10 mm to about 3 mm, e.g. about 15 mm to about 25 mm.

Width $W_R$ of plate 224 may range from about 0.5 mm to about 40 mm, e.g. from about 10 mm to about 3 mm, e.g. about 15 mm to about 25 mm.

Length $L_R$ of plate 224 may range from about 0.5 mm to about 40 mm, e.g. from about 10 mm to about 3 mm, e.g. about 15 mm to about 25 mm.

By way of example, with a 10 mm×10 mm chip-packaging module 182, i.e. $W_B$=10 mm, L=10 mm, holding a 3 mm×3 mm chip 104, i.e. $W_C$=3 mm, $L_C$=3 mm, plate 224 may be a 10 mm×10 mm plate, i.e. $W_P$=10 mm, $L_P$=10 mm, and inner ring size may be 3 mm×3 mm, i.e. $W_R$=3 mm, $L_R$=3 mm.

By way of example, with a 10 mm×10 mm chip-packaging module 182, i.e. $W_B$=10 mm, L=10 mm, holding a 3 mm×3 mm chip 104, i.e. $W_C$=3 mm, $L_C$=3 mm, plate 224 may be a 9 mm×9 mm plate, i.e. $W_P$=9 mm, $L_P$=9 mm, and inner ring size may be 2.5 mm×2.5 mm, i.e. $W_R$=2.4 mm, $L_R$=2.4 mm.

Figure 3:
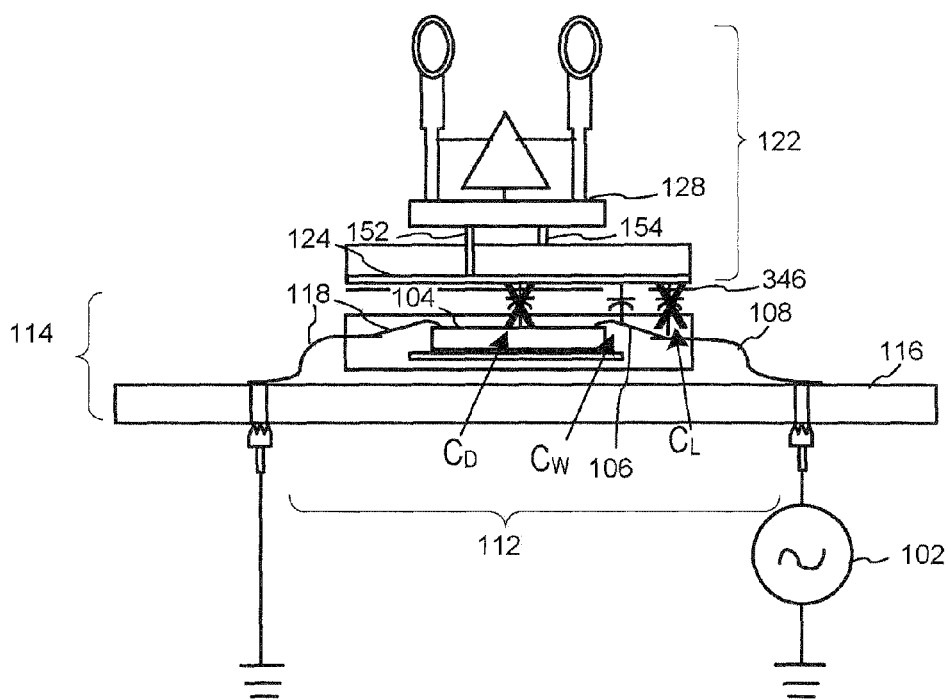
FIG. 3 shows a measuring device according to an embodiment.

FIG. 3 shows a measuring device 300 according to an embodiment. The basic functionalities of all the features described with respect to measuring device 100 and 200 are applicable to measuring device 300. According to an embodiment, measuring device 300 may include measuring device 100 described with respect to FIG. 1, further including a top shield plate 346 formed between chip arrangement 114 and plate 124.

Top shield plate 346 may be configured such that it is formed on the same side of chip arrangement 114 as plate 124.

Top shield plate 346 may be configured such that it is formed above at least part of chip 104, chip-carrier 116, and chip-to-chip-carrier connection 118.

Top shield plate 346 may be configured such that it shields, e.g. blocks, at least part of chip 104, chip-carrier 116, and chip-to-chip-carrier connection 118 from plate 124, and that at least part of chip 104, chip-carrier 116 and chip-carrier connection 118 is not shielded, e.g. not blocked, from plate 124 by top shield plate 346. E.g. Top shield plate 346 may be configured such that it minimizes or prevents electric signals transmitted by at least part of chip 104, chip-carrier 116, and chip-to-chip-carrier connection 118 from reaching plate 124, e.g. from electrically engaging plate 124, and that it allows electric signals transmitted by at least part of chip 104, chip-carrier 116, and chip-to-chip-carrier connection 118 to reach plate 124.

Top shield plate 346 may be configured such that it shields, e.g. blocks, at least part of chip 104 and chip-carrier connection 108 from plate 124 and such that chip connection 106 is not shielded from plate 124 by top shield plate 346. E.g. Top shield plate 346 may be configured such that it minimizes or prevents electric signals transmitted by at least part of chip 104 and chip-carrier connection 108 from reaching plate 124, and that it allows electric signals transmitted by chip connection 106 to reach plate 124.

Top shield plate 346 may be configured such that a non-targeted detection area of chip arrangement 114, e.g. at least part of chip 104 and one or more chip-carrier connections 108, 108a, 108b is shielded by top shield plate 346, and a targeted detection area of chip arrangement 114 e.g. one or more chip connections 106, 106a, 106b is not shielded by top shield plate 346.

Top shield plate 346 may be configured such that it is situated a pre-determined distance above chip arrangement 114, e.g. top shield plate 346 may be separated from chip arrangement 114 by a pre-determined distance and top shield plate 346 may be formed between chip arrangement 114 and plate 124. Top shield plate 346 may include an electrically conductive material. Top shield plate 346 may include a multilayer electrically conductive material. Top shield plate 346 may include one or more from the following group of materials, the group consisting of: Au, Cu, Ag, Al, Ti, Fe, Ni, brass and steel, e.g. V2A steel, NiP, CuAu, CuAg, CuNi.

Top shield plate 346 may be attached, e.g. fixed, to part of plate 124 via an adhesive, e.g. a glue.

Top shield plate 346 may be placed as close as possible to chip arrangement 114. Top shield plate 346 may be separated from chip arrangement 114 by a pre-determined distance d ranging from about 0.5 mm to about 20 mm, e.g. from about 0.6 mm to about 10 mm, e.g. from about 0.7 mm to about 3 mm.

Top shield plate 346 may be guarded, e.g. electrically connected to a ground voltage. Top shield plate 346 may be guarded, e.g. electrically connected to a voltage other than a ground voltage. The guard voltage provided to top shield plate 346 may range between about −0.55V to about +0.55V, e.g. between about −0.4V to about +0.4V, e.g. between about −0.25V to about +0.25V. The AC signal should not extend lower than −0.55V and higher than +0.55 V to avoid current flow over device input diodes.

Top shield plate 346 may enable top partial shielding, which promotes a mechanism of competitive detection of wire deformation, thereby minimizing noise from a non-targeted detection area of chip arrangement 114, e.g. chip 104, e.g. from one or more chip-carrier connections 108, 108a, 108b. E.g., capacitive impedance, $C_L$, between chip-carrier connection 108 and plate 124 and capacitive impedance, $C_D$, between chip 104 and plate 124 may be minimized. A larger plate area 124 in measuring device 300 compared to the plate area of plate 224 covering the target area of chip arrangement 114, e.g. chip connection 106, may result in a larger target area signal, i.e. a larger measurable signal of $C_W$.

According to another embodiment, plate 124 of measuring device 300 may include plate 224 described with respect to measuring device 200 of FIG. 2. Plate 224 of measuring device 300 may include all the features described above with respect to plate 224.

Figure 4:
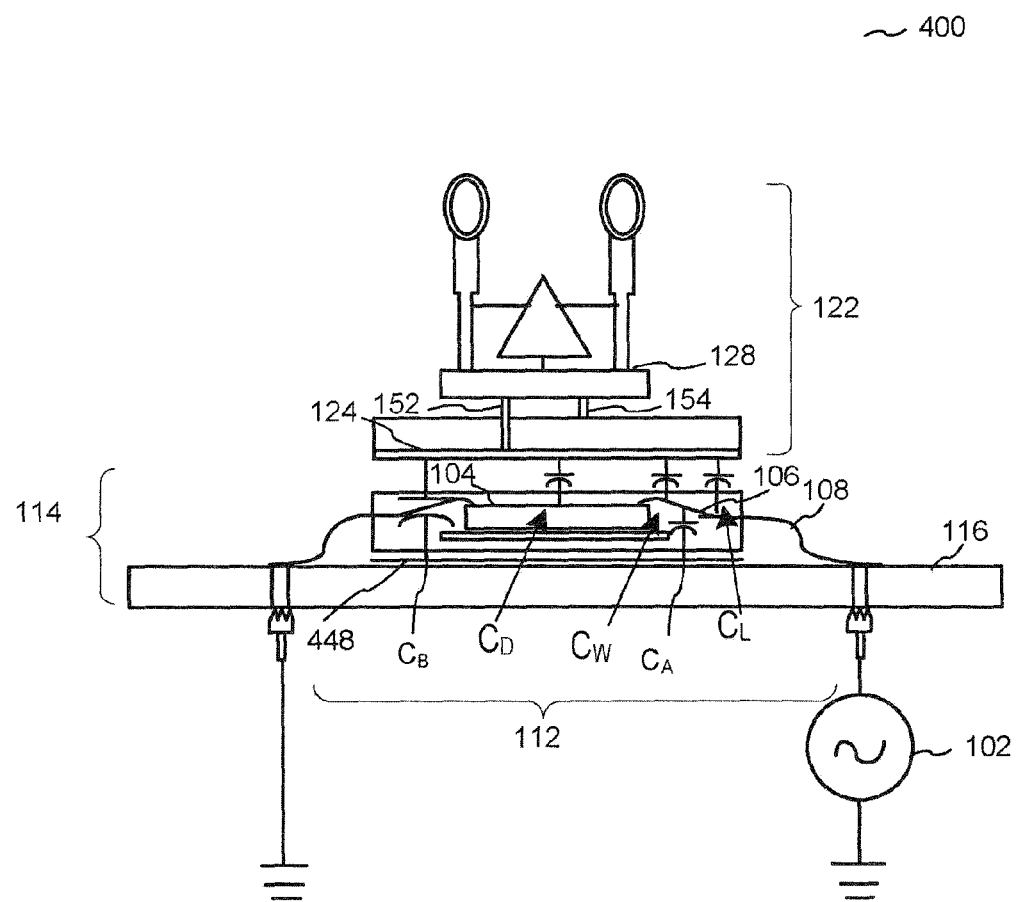
FIG. 4 shows a measuring device according to an embodiment.

FIG. 4 shows a measuring device 400 according to an embodiment. The basic functionalities of all the features described with respect to measuring device 100 and 200 are applicable to measuring device 400, with measuring device 400 further including a bottom shield plate 448 formed on the opposite side of chip arrangement 114 from probe plate 124. Bottom shield plate 448 may be configured such that it is formed on the opposite side of a targeted measurement area of chip arrangement 114, e.g. chip connection 106, from probe plate 124. Bottom shield plate 448 may be configured such that it is formed below chip arrangement 114. Bottom shield plate 448 may be configured such that it is situated a pre-determined distance below chip arrangement 114, e.g. bottom shield plate 448 may be separated from chip arrangement 114 by a pre-determined distance and is formed on the opposite side of chip arrangement 114 from probe plate 124.

Bottom shield plate 448 may include an electrically conductive material. Bottom shield plate 448 may include a multilayer electrically conductive material. Bottom shield plate 448 may include one or more from the following group of materials, the group consisting of: Au, Cu, Ag, Al, Ti, Fe, Ni, brass and steel, e.g. V2A steel, NiP, CuAu, CuAg, CuNi. Bottom shield plate 448 may be guarded, e.g. electrically connected to a voltage other than a ground voltage. The guard voltage provided to bottom shield plate 448 may range between about −0.55V to about +0.55V, e.g. between about −0.4V to about +0.4V, e.g. between about −0.25V to about +0.25V. The AC signal should not extend lower than −0.55V and higher than +0.55 V to avoid current flow over device input diodes.

Bottom shield plate 448 may enable bottom shielding, which promotes a mechanism of competitive detection of wire deformation, thereby maximizing signals detected from the targeted detection area of chip arrangement 114. Therefore, the targeted signal, e.g. a targeted signal from chip connection 106 may include capacitive impedance, $C_W$, between chip connection 106 and plate 124, and a further capacitive impedance, $C_A$, between bottom shield plate 448 and chip connection 106. The sum of capacitive impedance, $C_W$ and capacitive impedance, $C_A$ may be represented by a summation capacitive impedance $C_B$.

According to another embodiment, plate 124 of measuring device 400 may include plate 224 described with respect to measuring device 200 of FIG. 2. Plate 224 of measuring device 400 may include all the features described above with respect to plate 224.

Figure 5:
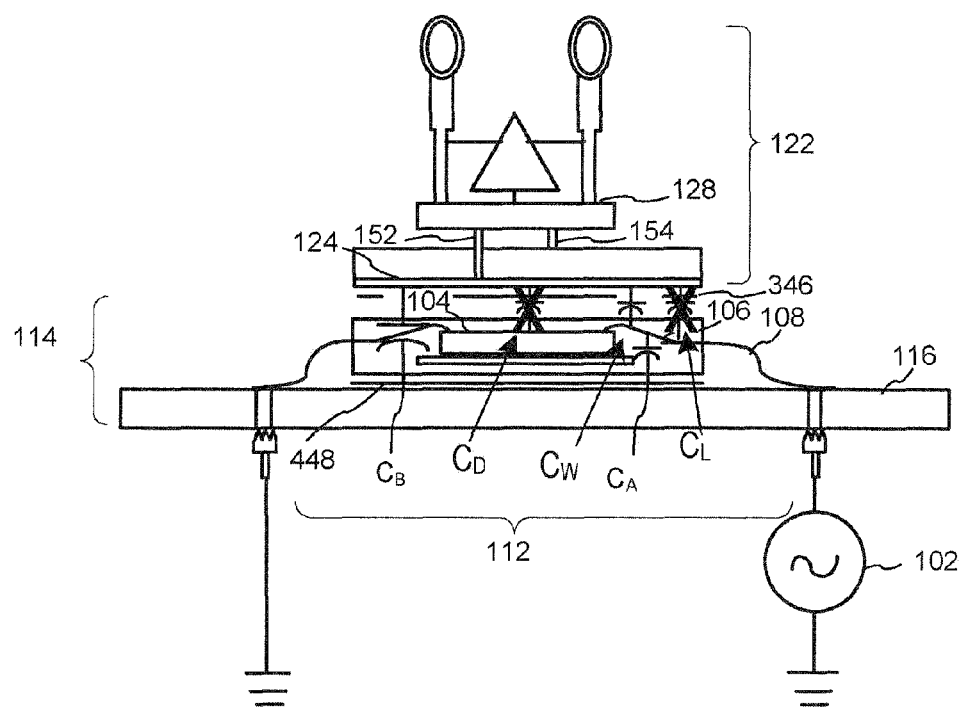
FIG. 5 shows a measuring device according to an embodiment.

FIG. 5 shows a measuring device 500 according to an embodiment. The basic functionalities of all the features described with respect to measuring device 100, 200, 300 and 400 are applicable to measuring device 500, with measuring device 500 further including top shield plate 346 described above with respect to measuring device 300, and bottom shield plate 448 described above with respect to measuring device 400.

Top shield plate 346 may be configured such that it is formed between chip arrangement 114 and plate 124 and that a non-targeted detection area of chip arrangement 114, e.g. at least part of chip 104 and one or more chip-carrier connections 108, 108a, 108b, is shielded by top shield plate 346, and a targeted detection area of chip arrangement 114 e.g. a chip connection 106 is not shielded by top shield plate 346. Bottom shield plate 448 may be configured such that it is formed on the opposite side of a targeted measurement area of chip arrangement 114, e.g. chip connection 106, from probe plate 124.

Top shield plate 346 may enable top partial shielding, which promotes the mechanism of competitive detection of wire deformation, thereby minimizing noise from a non-targeted detection area of chip arrangement 114, e.g. minimizing noise from chip 104, e.g. minimizing noise from one or more chip-carrier connections 108, 108a, 108b. E.g., capacitive impedance, $C_L$, between one or more chip-carrier connections 108, 108a, 108b and plate 124 and capacitive impedance, $C_D$, between chip 104 and plate 124 may be minimized. A larger plate area 124 in measuring device 300 compared to the plate area of plate 224 covering the target area of chip arrangement 114, e.g. chip connection 106, may result in a larger target area signal, i.e. a larger measurable signal of $C_W$.

Bottom shield plate 448 may enable bottom shielding, which promotes the mechanism of competitive detection of wire deformation, thereby maximizing signals detected from the targeted detection area of chip arrangement 114. Therefore, the targeted signal, e.g. a targeted signal from chip connection 106 may include capacitive impedance, $C_W$, between chip connection 106 and plate 124, and a further capacitive impedance, $C_A$, between bottom shield plate 448 and chip connection 106. The sum of capacitive impedance, $C_W$ and capacitive impedance, $C_A$ may be represented by a summation capacitive impedance $C_B$.

According to another embodiment, plate 124 of measuring device 500 may include plate 224 described with respect to measuring device 200 of FIG. 2. Plate 224 of measuring device 500 may include all the features described above with respect to plate 224.

FIG. 6 shows a method 600 for measuring a chip-to-chip-carrier connection, the method including:
configuring a power supply to provide electric power, e.g. AC power, e.g. an AC source signal, to a chip via at least one of a chip connection and a chip-carrier connection (in 610);
receiving a chip arrangement by a chip arrangement receiving portion, the chip arrangement including a chip and one or more chip-to-chip-carrier connections (in 620);
using a detection portion, including a plate and a detection circuit coupled to the plate, to detect an electrical signal from the plate while covering at least part of at least one of the chip, the chip-carrier, and the chip-to-chip-carrier connection with the plate (in 630); and
leaving at least part of the at least one of the chip, the chip-carrier, and the chip-to-chip-carrier connection uncovered by the plate (in 640).

Illustration 700 of FIG. 7 shows a computer arrangement 658 configured to execute instructions for measuring a chip-to-chip carrier connection, including
executing instructions for configuring a power supply to provide electric power, e.g. an electrical signal, e.g. an AC source signal, to a chip via at least one of a chip connection and a chip-carrier connection;
executing instructions for receiving a chip arrangement by a chip arrangement receiving portion, the chip arrangement including a chip and one or more chip-to-chip-carrier connections
executing instructions for using a detection portion, including a plate and a detection circuit coupled to the plate, to detect an electrical signal from the plate while covering at least part of at least one of the chip, the chip-carrier, and the chip-to-chip-carrier connection with the plate; and
executing instructions for leaving at least part of the at least one of the chip, the chip-carrier, and the chip-to-chip-carrier connection uncovered by the plate.

Computer arrangement 658 may be in electrical connection with detection circuit 126. Computer arrangement 658 may include a processing circuit 662, e.g. a central processing unit CPU for processing signal data from detection circuit 126. Processing circuit 662 may be connected to a controller circuit 664. Processing circuit 662 may include a controller circuit 664. Processing circuit 662 may be connected to at least one memory circuit, e.g. memory circuit 666, e.g. RAM circuit, e.g. memory circuit 668, ROM circuit. Processing circuit 662 may be connected to at least one of controller circuit 664, memory circuit 666 and memory circuit 664 by a bus circuit 672, e.g. a system bus.

Controller circuit 664 may be configured to process control instructions for measuring a chip-to-chip-carrier connection, including processing control instructions for configuring a power supply to provide electric power, e.g. an electrical signal, e.g. an AC source signal, to a chip via at least one of a chip connection and a chip-carrier connection;

processing control instructions for receiving a chip arrangement by a chip arrangement receiving portion, the chip arrangement including a chip and one or more chip-to-chip-carrier connections processing control instructions for using a detection portion, including a plate and a detection circuit coupled to the plate, to detect an electrical signal from the plate while covering at least part of at least one of the chip, the chip-carrier, and the chip-to-chip-carrier connection with the plate; and processing control instructions for leaving at least part of the at least one of the chip, the chip-carrier, and the chip-to-chip-carrier connection uncovered by the plate.

A measuring device according to various embodiments is provided, the measuring device, including: a power supply configured to provide electric power to a chip via at least one of a chip connection and a chip-carrier connection; a chip arrangement receiving portion configured to receive a chip arrangement, the chip arrangement including a chip and a chip-carrier connected to the chip via one or more chip-to-chip-carrier connections; a detection portion including: a plate; a detection circuit coupled to the plate and configured to detect an electrical signal from the plate; wherein the plate is configured such that it covers at least part of at least one of the chip, the chip-carrier, and the chip-to-chip-carrier connection; and wherein the plate is further configured such that at least part of the at least one of the chip, the chip-carrier, and the chip-to-chip-carrier connection is uncovered by the plate.

According to an embodiment, the power supply includes an AC signal source configured to provide an AC electrical signal to a chip.

According to an embodiment, the plate is configured such that it covers at least part of the one or more chip-to-chip-carrier connections and such that at least part of the chip and the chip-carrier is uncovered by the plate.

According to an embodiment, the plate is configured such that it covers at least part of the chip connection and that at least part of the chip, the chip-carrier and the chip-carrier connection are uncovered by the plate.

According to an embodiment, the plate is configured such that it covers at least part of the one or more chip-to-chip-carrier connections.

According to an embodiment, the plate is configured such that it covers at least part of one or more chip connections.

According to an embodiment, the plate is configured to include one or more from the following group of materials, the group consisting of: Au, Cu, Ag, Al, Ti, Fe, Ni, brass steel, V2A steel, NiP, CuAu, CuAg, CuNi.

According to an embodiment, the plate includes one or more from the following group of plates, the group consisting of: a two-dimensional plate, a three-dimensional plate, a plate with a center portion removed, a rectangular ring plate, a circular ring plate.

According to an embodiment, the chip includes a semiconductor chip.

According to an embodiment, each chip-to-chip-carrier connection includes a chip-carrier connection connected to the chip via a chip connection.

According to an embodiment, the chip-carrier connection includes at least part of one or more from the following group of chip-carrier connections, the group consisting of: a lead frame, an electrically conductive trace, a metal trace in substrate, an electrically conductive wire, a wire bond, a flip-chip bump, a through-silicon via TSV, a through-mold via TMV, a chip-package interconnect. According to an embodiment, the chip connection includes an electrically conductive material.

According to an embodiment, the power supply is configured to provide electric power to a chip via at least one of a first chip connection and a first chip-carrier connection and wherein at least one further chip-carrier connection is connected to a ground voltage.

According to an embodiment, the detection circuit is configured to detect at least one of a group of signals consisting of the following: capacitive impedance between the chip arrangement and the plate, capacitive impedance between the chip and the plate, capacitive impedance between the chip connection and the plate, capacitive impedance between the carrier connection and the plate.

According to an embodiment, the measuring device further includes a top shield plate formed between the chip arrangement and the plate.

According to an embodiment, the top shield plate is configured such that it shields at least part of the chip, the chip-carrier, and the chip-to-chip-carrier connection from the plate, and such that at least a portion of the chip, the chip-carrier and the chip-carrier connection is not shielded from the plate by the top shield plate.

According to an embodiment, the top shield plate is configured such that it shields at least part of the chip and the chip-carrier connection from the plate and such that the chip connection is not shielded from the plate by the top shield plate.

According to an embodiment, the top shield plate includes an electrically conductive material.

According to an embodiment, the measuring device further includes a bottom shield plate formed on the opposite side of the chip arrangement from the probe plate.

According to an embodiment, the bottom shield plate is configured such that it is formed on the opposite side of a chip connection from the probe plate.

According to an embodiment, the bottom shield plate includes an electrically conductive material.

According to an embodiment, the measuring device further includes a multiplexer circuit for selecting electrical signals from the plate.

According to an embodiment, the measuring device further includes a processing circuit for processing one or more electrical signals detected by the detection circuit.

A method for measuring a chip-to-chip-carrier connection is provided, the method including: configuring a power supply to provide electric power to a chip via at least one of a chip connection and a chip-carrier connection; receiving a chip arrangement by a chip arrangement receiving portion, the chip arrangement including a chip and one or more chip-to-chip-carrier connections; using a detection portion, including a plate and a detection circuit coupled to the plate, to detect an electrical signal from the plate while covering at least part of at least one of the chip, the chip-carrier, and the chip-to-chip-carrier connection with the plate; and leaving at least part of the at least one of the chip, the chip-carrier, and the chip-to-chip-carrier connection uncovered by the plate.

Figure 8A:
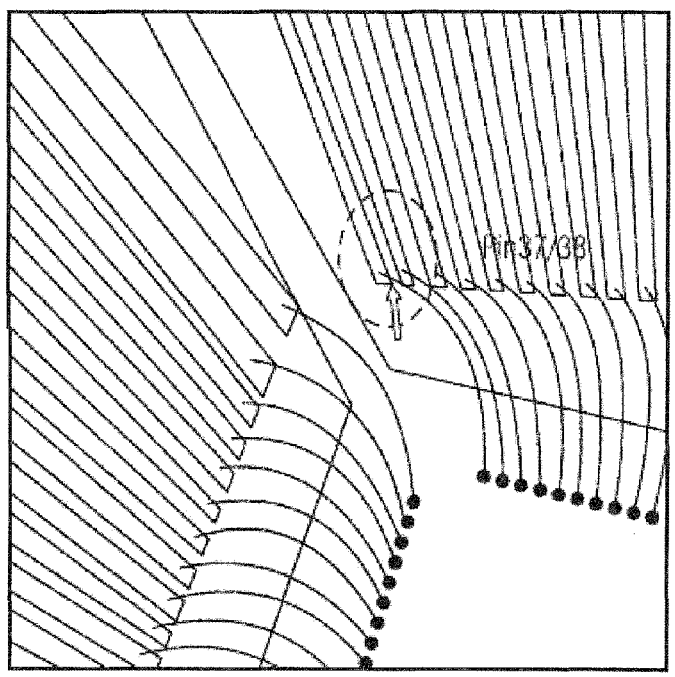
FIGS. 8A, 8B and 8C show x-ray detected faults in measured devices.
Figure 8B:
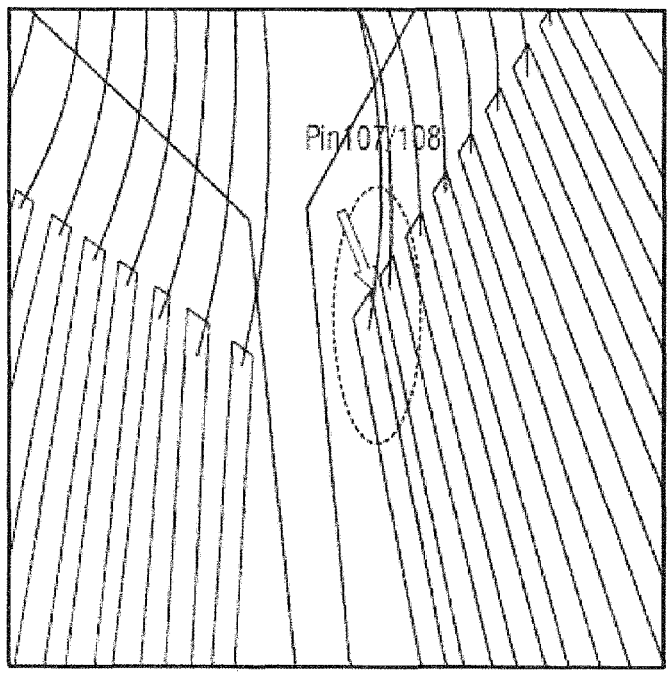

FIGS. 8A-8B show close up X-ray for a device labeled #4. Illustration 800 of FIG. 8A shows a close up x-ray of chip-to-chip connections, e.g. pin 37 and 38. Illustration 810 of FIG. 8B shows a close up x-ray of chip-to-chip connections, e.g. pin 107 and 108. The anomalies of at least one of pin 37, 38, 107 and 108 of device #4 may include a carrier connection 108, e.g. a lead finger, that is horizontally bent, and showing wire sweep.

Figure 8C:
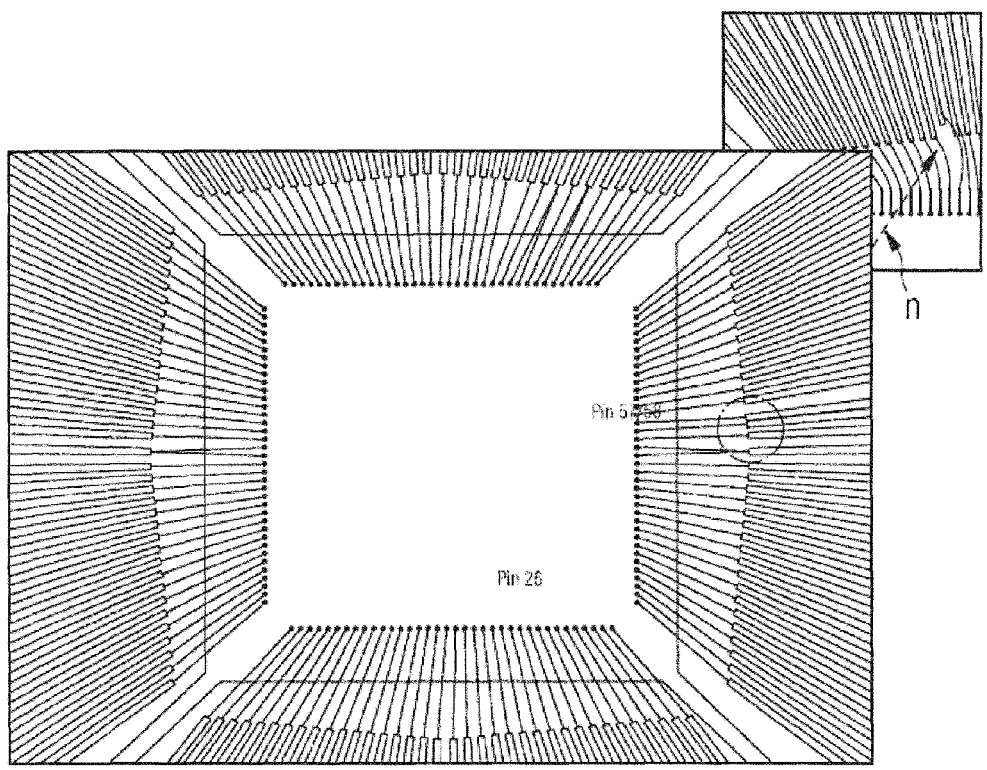

FIG. 8C shows a close up X-ray for a device labeled #5. Illustration 820 shows a close up x-ray of chip-to-chip connections, e.g. pin 26, e.g. pin 57 and 58. The anomalies of at least one of pins 57 and 68 of device #5 may include a carrier connection 108, e.g. a lead finger, which is vertically bent.

Figure 8D:
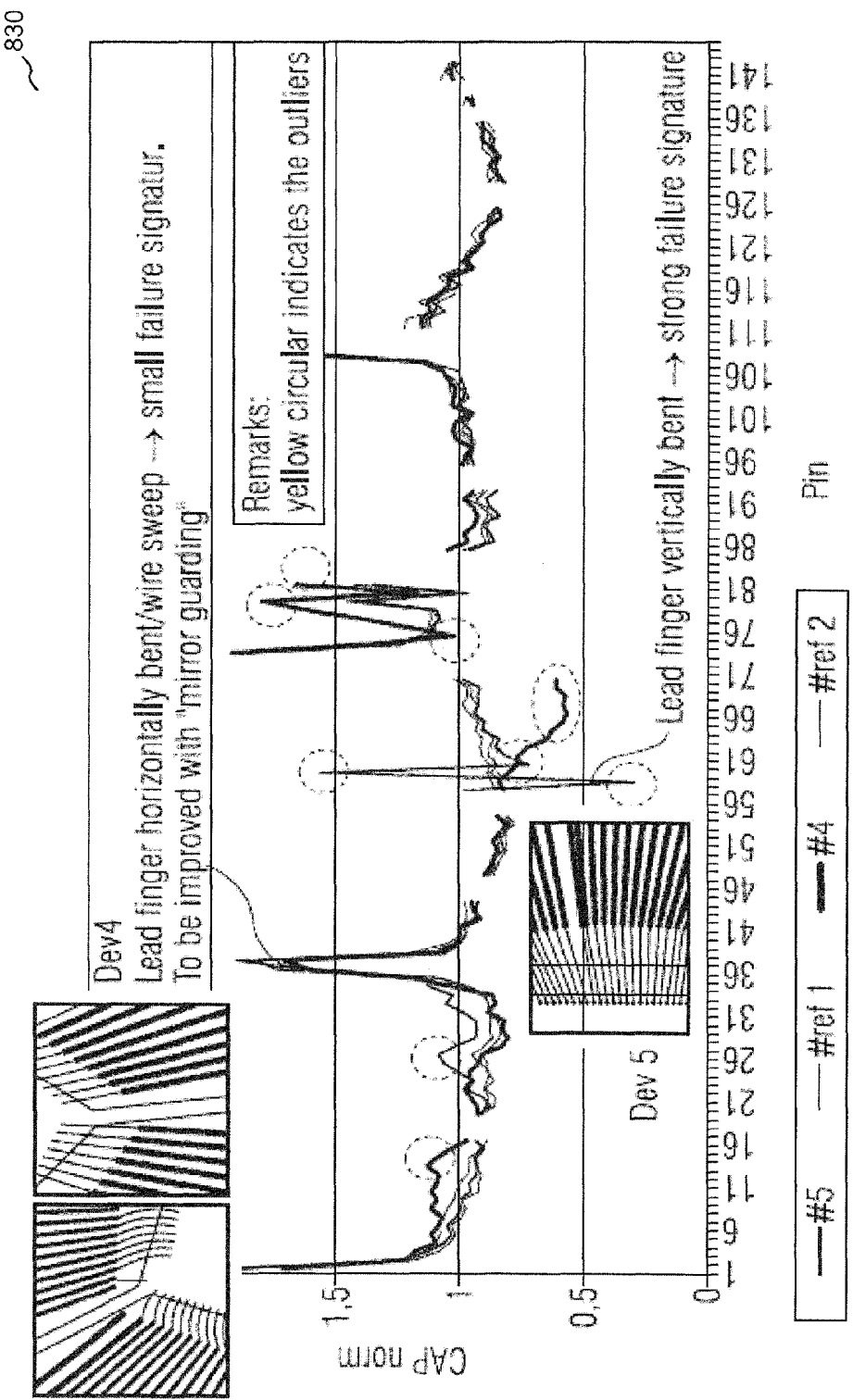
FIG. 8D shows a measurement using a measuring device according to an embodiment.

Illustration 830 of FIG. 8D shows the measured capacitance vs. pin number for device #4 and device #5 with known anomalies, and reference devices #ref 1 and #ref 2, measured using a measuring device 100 according to an embodiment.

The anomalies of horizontally bending and wire sweep demonstrate a small failure signature of device #4 in comparison with reference devices #ref 1 and #ref 2. The signal should be improved with mirror guarding. The anomalies of vertical bending of a lead frame of device #5 demonstrate a strong failure signature.

Various embodiments provide a device and a method for detecting anomalies and deviations from the normal capacitances induced by well-working electrical connections between a chip and a leadframe. By detecting deviations from normal capacitances early, defects, e.g. defects in leadframe fingers, leadframe pins, bond wires, may be identified, and "outlier" devices, may be discarded possibly even before the device measurements, thereby substantially contributing to the quality improvement of devices.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

What is claimed is:

1. A measuring device, comprising:
   a power supply configured to provide electric power to a chip via at least one of a chip connection and a chip-carrier connection;
   a chip arrangement receiving portion configured to receive a chip arrangement, the chip arrangement comprising a chip and a chip-carrier connected to the chip via one or more chip-to-chip-carrier connections;
   a detection portion comprising:
      a sensor plate with a center portion removed;
      a detection circuit coupled to the sensor plate and configured to detect an electrical signal from the sensor plate;
      wherein the sensor plate is configured such that it covers at least part of at least one of the chip, the chip-carrier, and the chip-to-chip-carrier connection; and
      wherein the sensor plate is further configured such that at least part of the at least one of the chip, the chip-carrier, and the chip-to-chip-carrier connection is uncovered by the sensor plate;
   a top shield plate formed between the chip arrangement and the sensor plate, wherein the to shield plate is arranged in one of a first configuration or a second configuration, wherein in the first configuration the to shield plate is arranged such that it shields at least part of the chip, the chip-carrier, and the chip-to-chip-carrier connection from the sensor plate such that at least a portion of the chip, the chip-carrier and the chip-carrier connection is not shielded from the sensor plate by the to shield plate, and wherein in the second configuration the to shield plate is arranged such that it shields at least part of the chip and the chip-carrier connection from the sensor plate such that the chip connection is not shielded from the sensor plate by the to shield plate; and
   a bottom shield plate formed between the chip and the chip-carrier.

2. The measuring device according to claim 1, wherein the power supply comprises an AC signal source configured to provide an AC electrical signal to a chip.

3. The measuring device according to claim 1, wherein the sensor plate is configured such that it covers at least part of the one or more chip-to-chip-carrier connections and such that at least part of the chip and the chip-carrier is uncovered by the sensor plate.

4. The measuring device according to claim 1, wherein the sensor plate is configured such that it covers at least part of the chip connection and that at least part of the chip, the chip-carrier and the chip-carrier connection are uncovered by the sensor plate.

5. The measuring device according to claim 1, wherein the sensor plate is configured such that it covers at least part of the one or more chip-to-chip-carrier connections.

6. The measuring device according to claim 1, wherein the sensor plate is configured such that it covers at least part of one or more chip connections.

7. The measuring device according to claim 1, wherein the sensor plate is configured to comprise one or more from the following group of materials, the group consisting of: Au, Cu, Ag, Al, Ti, Fe, Ni, brass steel, V2A steel, NiP, CuAu, CuAg, CuNi.

8. The measuring device according to claim 1, wherein the sensor plate comprises one or more from the following group of sensor plates, the group consisting of: a two-dimensional sensor plate, a three-dimensional sensor plate, a rectangular ring sensor plate, a circular ring sensor plate.

9. The measuring device according to claim 1, wherein the chip comprises a semiconductor chip.

10. The measuring device according to claim 1, wherein each chip-to-chip-carrier connection comprises a chip-carrier connection connected to the chip via a chip connection.

11. The measuring device according to claim 1, wherein the chip-carrier connection comprises at least part of one or more from the following group of chip-carrier connections, the group consisting of: a lead frame, an electrically conductive trace, a metal trace in substrate, an electrically conductive wire, a wire bond, a flip-chip bump, a through- silicon via TSV, a through-mold via TMV, a chip-package interconnect.

12. The measuring device according to claim 1, wherein the chip connection comprises an electrically conductive material.

13. The measuring device according to claim 1, wherein the power supply is configured to provide electric power to a chip via at least one of a first chip connection and a first chip-carrier connection and wherein at least one further chip-carrier connection is connected to a ground voltage.

14. The measuring device according to claim 1, wherein the detection circuit is configured to detect at least one of a group of signals consisting of the following: capacitive impedance between the chip arrangement and the sensor plate, capacitive impedance between the chip and the sensor plate, capacitive impedance between the chip connection and the sensor plate, capacitive impedance between the chip-carrier connection and the sensor plate.

15. The measuring device according to claim 1, wherein the top shield plate comprises an electrically conductive material.

16. The measuring device according to claim 1, wherein the bottom shield plate is configured such that it is formed on an opposite side of a chip connection from the sensor plate.

17. The measuring device according to claim 1, wherein the bottom shield plate comprises an electrically conductive material.

18. The measuring device according to claim 1, further comprising a multiplexer circuit for selecting electrical signals from the sensor plate.

19. The measuring device according to claim 1, further comprising a processing circuit for processing one or more electrical signals detected by the detection circuit.

20. A method for measuring a chip-to-chip carrier connection, the method comprising:
   configuring a power supply to provide electric power to a chip via at least one of a chip connection and a chip-carrier connection;
   receiving a chip arrangement by a chip arrangement receiving portion, the chip arrangement comprising a chip and a chip-carrier connected to the chip via one or more chip-to-chip-carrier connections;
   providing a detection portion comprising:
      a sensor plate with a center portion removed;
      a detection circuit coupled to the sensor plate and configured to detect an electrical signal from the sensor plate;
      wherein the sensor plate is configured such that it covers at least part of at least one of the chip, the chip-carrier, and the chip-to-chip-carrier connection; and
      wherein the sensor plate is further configured such that at least part of the at least one of the chip, the chip-carrier, and the chip-to-chip-carrier connection is uncovered by the sensor plate;
   forming a top shield plate between the chip arrangement and the sensor plate, wherein the to shield plate is arranged in one of a first configuration or a second configuration, wherein in the first configuration the to shield plate is arranged such that it shields at least part of the chip, the chip-carrier, and the chip-to-chip-carrier connection from the sensor plate such that at least a portion of the chip, the chip-carrier and the chip-carrier connection is not shielded from the sensor plate by the to shield plate, and wherein in the second configuration the to shield plate is arranged such that it shields at least part of the chip and the chip-carrier connection from the sensor plate such that the chip connection is not shielded from the sensor plate by the to shield plate; and
   forming a bottom shield plate between the chip and the chip-carrier.

* * * * *

UNITED STATES PATENT AND TRADEMARK OFFICE
CERTIFICATE OF CORRECTION

PATENT NO. : 8,896,320 B2
APPLICATION NO. : 13/222101
DATED : November 25, 2014
INVENTOR(S) : Franz Schoenberger, Johann Koelz and Ming Xue It is certified that error appears in the above-identified patent and that said Letters Patent is hereby corrected as shown below:

In the Claims

Column 16, line 11, claim 1, delete "to shield" and write "top shield" in place thereof.

Column 18, line 25, claim 20, delete "to shield" and write "top shield" in place thereof.

Signed and Sealed this
Twelfth Day of May, 2015

Michelle K. Lee
*Director of the United States Patent and Trademark Office*